(12) United States Patent
Kubena et al.

(10) Patent No.: US 10,389,392 B1
(45) Date of Patent: Aug. 20, 2019

(54) HIGH-Q QUARTZ-BASED INDUCTOR ARRAY FOR ANTENNA MATCHING

(71) Applicant: HRL Laboratories, LLC, Malibu, CA (US)

(72) Inventors: Randall L. Kubena, Oak Park, CA (US); Walter S. Wall, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/801,642

(22) Filed: Nov. 2, 2017

Related U.S. Application Data

(60) Provisional application No. 62/417,111, filed on Nov. 3, 2016.

(51) Int. Cl.
*H04B 1/04* (2006.01)
*H04B 1/00* (2006.01)
(Continued)

(52) U.S. Cl.
CPC .............. *H04B 1/006* (2013.01); *H01Q 1/523* (2013.01); *H01Q 5/335* (2015.01); *H01Q 21/065* (2013.01); *H03H 9/2405* (2013.01)

(58) Field of Classification Search
CPC ........ H03H 9/1021; H01Q 7/00; H01Q 13/10; H01Q 1/243; H01Q 21/062; H01Q 5/357;
(Continued)

(56) References Cited

U.S. PATENT DOCUMENTS 6,888,424 B2 * 5/2005 Takeuchi ................. H03H 3/04
310/320
7,750,535 B2 7/2010 Kubena
(Continued)

FOREIGN PATENT DOCUMENTS

EP 0496583 A2 7/1992

OTHER PUBLICATIONS

U.S. Appl. No. 15/638,052, filed Jun. 29, 2017, Wall et al.
(Continued)

*Primary Examiner* — Nhan T Le
(74) *Attorney, Agent, or Firm* — Ladas & Parry

(57) ABSTRACT

A resonator is formed from a unitary slab of a plate of quartz material which is KT cut with a theta cut angle between 20 and 35 degree, the unitary slab of a plate of quartz material having vertical side walls defining (i) an elongated central portion, the elongated central portion having a centerline along its major dimension, the elongated central portion resonating, in use, in an extensional mode disposed at a right angle to said centerline, (ii) a pair of isolating springs integrally connected to said central portion at the centerline thereof and (iii) first and second pairs of tethers, each one of the pairs tethers being integrally connected at a mid point of each the first and second pairs of tethers to ends of the isolating springs remote from the elongated central portion, each of the pairs tethers having two arms which wrap around the elongated central portion so that an end of one arm of the one of the tether approaches, but does not contact, an end of an arm of the another one of the tethers. The elongated central portion has two major opposing surfaces with a first pair of parallel electrodes disposed on one of the two opposing surfaces and with a second pair of parallel electrodes disposed on the other one of the two opposing surfaces. Interconnecting conductors disposed on the elon-
(Continued)

gated central portion, on the isolating springs and on the first and second tethers, interconnecting conductors electrically connecting the first and second electrodes with pads located at the ends of the arms of said tethers.

36 Claims, 8 Drawing Sheets

(51) Int. Cl.
*H01Q 5/335* (2015.01)
*H03H 9/24* (2006.01)
*H01Q 1/52* (2006.01)
*H01Q 21/06* (2006.01)

(58) Field of Classification Search
CPC .. H01Q 9/0421; H04B 13/005; H04B 5/0037; H04B 5/0081
See application file for complete search history.

(56) References Cited

U.S. PATENT DOCUMENTS

| | | | |
|---|---|---|---|
| 7,851,971 B2 | 12/2010 | Chang | |
| 8,390,387 B2* | 3/2013 | Lander | H03H 3/0076 310/321 |
| 8,765,615 B1 | 7/2014 | Chang et al. | |
| 8,912,711 B1 | 12/2014 | Chang | |
| 2016/0118954 A1* | 4/2016 | Clark | H02N 1/008 310/300 |
| 2017/0359025 A1* | 12/2017 | Kishi | H03B 5/32 |

OTHER PUBLICATIONS

U.S. Appl. No. 14/973,701, filed Dec. 17, 2015, Randall L. Kubena.
Filter Inductors—1812FS Series Datasheet, Oct. 12, 2015, retrieved online at: www.coilcraft.com/pdfs/1812fs.pdf.
"RF Energy Harvesting Design Using High Q Resonators", T. Ungan, X Le Polozec, W. Walker, and L. Reindl, IEEE MTT-S International Microwave Workshop on Wireless Sensing, Local Positioning, and RFID, IMWS 2009, pp: 1-4. IEEE, 2009.
"Next Generation Quartz Oscillators and Filters for VHF-UHF Systems," R. L. Kubena, F. P. Stratton, D. T. Chang, R. J. Joyce, and T. Y. Hsu, 2006 IEEE International Microwave Symposium, San Francisco, CA., Jun. 11-16, 2006.
"UHF Quartz MEMS Oscillators for Dynamics-Based System Enhancements", R. L. Kubena, D. J. Kirby, Yook-Kong Yong, D. T. Chang, F. P. Stratton, H. D. Nguyen, R. J. Joyce, R. Perahia, H. P. Moyer, and R. G. Nagele, 2013 IEEE International Frequency Control Symposium, Prague, Czech Republic, Jul. 22-26, 2013.
"New Cuts for Width-Extensional Mode Quartz Crystal Resonators", H. Kawashima, Electronics & Communications in Japan, Part 3, vol. 76, No. 12, pp. 28-36, Apr. 1993.
"MEMS-based UHF Monolithic Crystal Filters for Integrated RF Circuits," R. L. Kubena, H. D. Nguyen, R. Perahia, F. P. Stratton, R. J. Joyce, D. T. Chang, D. J. Kirby, and P. D. Brewer, Journal of Microelectromechanical Systems, vol. 25, No. 1, pp. 118-124, Feb. 2016.
"Wideband Coherent Communication at VLF with the Experimental Transmitting Antenna Modulator (ETAM)", J.T. Gamble, No. RADC-TR-73-287, Rome Air Development Center, Air Force Systems Command, Griffiss Air Force Base, NY, Dec. 1973.
"Direct Antenna Modulation (DAM) for Enhanced Capacity Performance of Near-Field Communication (NFC) Link", U. Azad and Y.E. Wang, IEEE Transactions on Circuits and Systems—I: Regular Papers vol. 61, No. 3, pp: 902-910, Mar. 2014.
U.S. Appl. No. 15/899,122 filed Feb. 19, 2018, Kubena.
U.S. Appl. No. 15/965,652 filed Apr. 27, 2018, Kubena.
Hansen, R.C. et al., "Small Antenna Handbook," John Wiley & Sons, Inc., 2011, Chapter 3.
Klemmer, T.J. et. al., "Ultrahigh Frequency Permeability of Sputtered Fe-Co-B Thin Films," Journal of Applied Physics, vol. 87, No. 2, Jan. 15, 2000.
Liang, C-Y et. al., "Modeling of Magnetoelastic Nanostructures with a Fully Coupled Mechanical-Micromagnetic Model," Nanotechnology 25 (2014).
Statek, CX1SM Crystal Datasheet, first accessed Mar. 14, 2016.
Yao, Zhi, et al., "Bulk Acoustic Wave Mediated Multiferroic Antennas: Architecture and Performance Bound," IEEE Transactions on Antennas and Propagation, vol. 63, No. 8, Aug. 2015, pp. 3335-3344.
Zhai, J. et. al., "Detection of Pico-Tesla Magnetic Fields using Magnetic-Electric Sensors at Room Temperature," Applied Physics Letters 88, (2006).

* cited by examiner

Parameters
$C_0 = 0.428\ pF$
$C_1 = 1.26\ fF$
$L_1 = 0.2\ H$
$R_1 = 15\ ohms$

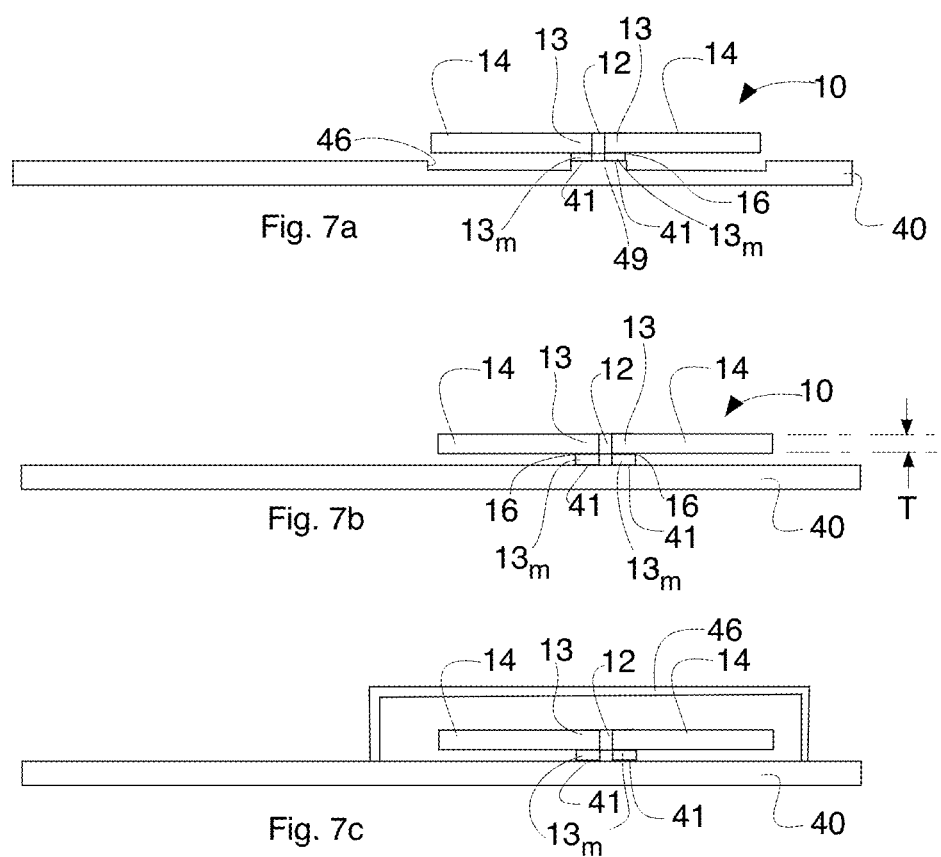

Array size is m x m

HIGH-Q QUARTZ-BASED INDUCTOR ARRAY FOR ANTENNA MATCHING

CROSS REFERENCE TO RELATED APPLICATIONS

This application claims the benefit of U.S. Provisional Patent Application No. 62/417,111 filed Nov. 3, 2016 entitled "High-Q Quartz-based Inductor Array for Antenna Matching" the disclosure of which is hereby incorporated herein by reference.

This application is also related to U.S. Provisional Patent Application No. 62/522,573 filed 20 Jun. 2017 also entitled "A New HF-VHF Quartz MEMS Resonator" which application is hereby incorporated herein by reference.

This application is related to U.S. patent application Ser. No. 15/638,052 filed 29 Jun. 2017 which is entitled "Antenna Loaded with Electromechanical Resonators" and which application is hereby incorporated herein by reference. This application is also related to U.S. Provisional Patent Application No. 62/356,734 filed 30 Jun. 2016 also entitled "Antenna Loaded with Electromechanical Resonators" which application is also hereby incorporated herein by reference.

This application is also related to U.S. patent application Ser. No. 14/973,701 filed 17 Dec. 2015 which is entitled "An Integrated Quartz MEMS Tuning Fork Resonator/Oscillator" and which application is hereby incorporated herein by reference.

STATEMENT REGARDING FEDERALLY SPONSORED RESEARCH OR DEVELOPMENT

None

TECHNICAL FIELD

This invention relates to arrays of high-Q electromechanical inductors which may be used for antenna impedance matching.

BACKGROUND

U.S. patent application Ser. No. 15/638,052 filed 29 Jun. 2017 entitled "Antenna Loaded with Electromechanical Resonators" relates to the use of arrays of electromechanical resonators in connection with antennas. Some the embodiments disclosed therein may include applications in higher frequency bands (e.g., 3 to 10 MHz) for small handheld portable wireless systems. In addition to increasing the bandwidth of such systems, frequency hopping using FSK (Frequency Shift Keying) is also disclosed. This may use multiple HF resonators that can be operated at moderate power levels (~1 W) each with a different mechanical resonant frequency. A new HF MEMS-based resonator design and manufacturing method is disclosed which allows the resonators to be fabricated in an array on a single thermally conductive substrate to minimize heating and allow wafer-level packaging to reduce the size of the inductor array. Moreover, the design and manufacturing allows integration with switches and other electronics needed for antenna matching and frequency shifting.

Previous VHF inductors used for antenna matching have consisted primarily of wire coils (several mm$^3$ in volume) with Quality Factors (Qs)<50 and inductances in the 100's of nH range. As the frequency decreases, the matching inductances for antennas increases and the resistance tends to increase unless the coil becomes very much larger (>5000 cm$^3$). In the HF frequency range, traditional compact commercial coils have Qs<50, inductances of 0.1 to 1 mH, volumes of 100 mm$^3$ and weight of 0.5 gm. The quartz-based inductors disclosed herein can have Qs=600, inductances of 1 to 10 mH, volumes of about 4 mm$^3$ and a weight of about 5×10$^{-3}$ g. In addition, using the disclosed MEMS-based process, arrays of inductors can be fabricated on the same chip with different resonant frequencies for improving the bandwidth. The substrate can be chosen to incorporate electronics for frequency switching or antenna matching and/or can be chosen for high thermal conductivity for minimized heating during high power operation. Finally, the disclosed quartz inductors will be fabricated from temperature compensated cuts of quartz, thereby providing high frequency stability of 10s of ppm over typical temperature ranges of −20° to +100° C. This is several orders of magnitude better than that obtained with other MEMS resonators such as Si or AlN.

Some of the embodiments disclosed herein may be useful in LF and VLF antenna systems for GPS-denied applications, such as, underwater communication, and long-range ground communication systems. At higher frequencies, HF communication links are of great interest for ground deployed military forces due to their ability to travel long distances, penetrate more easily through cluttered environments, and relative immunity to compact radio-monitoring techniques. Thus, high-Q electromechanical devices with high inductances may play an important role in next generation transmitter systems for a variety of frequency ranges and systems. In particular, the disclosed quartz MEMS high-Q inductors may provide enabling capabilities for RF transmitters in a variety of frequency ranges.

In addition, HF oscillators with low phase noise can be constructed from the disclosed resonators and used for timing references. Due to their lower resonant frequency than previous shear-mode resonators made by HRL Laboratories LLC, the Q of the disclosed resonators are expected to be higher. This results in lower phase noise and Allan Deviation. Precision navigation and timing applications consistently demand higher levels of frequency stability.

Extensional-mode quartz resonators have been manufactured by several quartz manufacturers in the frequency range of 500 kHz to 32 MHz. However, in order to produce an electric field in the crystalline x direction for exciting the extensional mode, the previous designs used electrodes which are wrapped around the edges of the quartz plate, similar to a tuning fork design. The shadow masking technique using for the previous devices is hard to implement in a wafer-level process and can lead to misalignments and low yield. Our new design makes use of opposing edge electrodes described in U.S. patent application Ser. No. 14/973, 701, identified above, with vias in the quartz to connect the top electrodes to a bottom-side bonding pad. A new bonding pad geometry is described in which the pads are positioned on tethers and bonded to the substrate in close proximity to each other on opposite sides of the narrow portion of the resonator for each signal polarity. This reduces the stress between the quartz and the substrate, and the parallel connections for each electrode of similar polarity reduce the interconnect resistance, which helps in maintaining high Q. By attaching the bonding pads to tethers and placing the bonding pads in close proximity, the bonding yield is improved and arbitrary high thermal conductivity substrates can be utilized for removing heat from the resonator. Folded springs are proposed for attachment between the resonator and the tethers for minimizing modal energy losses to the substrate and maintaining high Q.

Previous extensional-mode resonators have been fabricated with wet-etching techniques using small quartz blanks thus producing highly asymmetric sidewall profiles around the resonator plate. The proposed process is compatible with HRL quartz-MEMS wafer-level processes (see U.S. Pat. No. 8,765,615) in which dry plasma etching is used to define the quartz pattern in roughly 100-µm-thick quartz bonded to a handle wafer and the improvements suggested by U.S. Provisional Patent Application No. 62/522,573, which produce near vertical profiles for tighter dimensional control on the design and a better performance match to simulation. This wafer-level process, in turn, provides for wafer-level encapsulation, which is not possible for commercial quartz resonators. This leads to a smaller and lighter overall package. U.S. Pat. No. 8,765,615 and U.S. Provisional Patent Application No. 62/522,573 are hereby incorporated herein by reference.

For extensional mode devices, the dimension of the resonator along its lateral x-axis determines its frequency. We vary the width of the resonators across a wafer to produce a range of resonant frequencies for frequency switching applications in a small, low-cost package.

The use of quartz resonator for high-Q inductors for distributed loading antennae to improve their efficiently for low frequency RF transmitters has recently been of interest. See the discussion of U.S. patent application Ser. No. 15/638,052 above. However, the power handling of small quartz resonators can be an issue. Typically, VHF shear-mode quartz resonators become nonlinear and their phase noise properties degrade for oscillator applications when voltages exceed roughly a volt across the resonator at powers of ~1 mW. In addition, heating can shift the series resonance by 10 s of ppm. For critical timing applications this can be problematic. However, using extensional mode resonators at lower frequencies, the distance between driving electrodes can be increased by as much as a factor of ten compared to common VHF shear-mode resonators (e.g., 600 µm compared to 60 µm). Moreover, for antenna coupling applications, a degradation in the linearity and small shifts in the series resonance can often be tolerated. In addition, by using designs which allow integration on highly thermally conductive substrates, such as thin copper sheets, one can design extensional-mode resonators with high Q, low temperature sensitivity, and small size that can withstand a higher power (~1 W) than has previously been assumed.

These resonators, at lower power levels, can also be used for arrays of HF oscillators on a single chip if integrated with typical sustaining circuits in the substrate using the HRL quartz MEMS processes mentioned above.

BRIEF DESCRIPTION OF THE INVENTION

In one aspect the present invention provides a resonator comprising: a unitary slab of a plate of quartz material which is preferably KT cut with a theta cut angle between 20 and 35 degree, the unitary slab of a plate of quartz material having vertical side walls defining: (i) an elongated central portion, the elongated central portion having a centerline along its major dimension, the elongated central portion resonating, in use, in an extensional mode disposed at a right angle to said centerline, (ii) a pair of isolating springs integrally connected to said central portion at the centerline thereof and (iii) first and second tethers, each one of said tethers being integrally connected at a midpoint of each said first and second tethers to ends of said isolating springs remote from said elongated central portion, each of said tethers having two arms which wrap around said elongated central portion so that an end of one arm of the first tether approaches, but does not contact an end of one arm of the second tether and also so that an end of a second arm of the first tether approaches, but does not contact an end of a second arm of the second tether; the elongated central portion having two major opposing surfaces with a first pair of parallel electrodes disposed on one of the two opposing surfaces and with a second pair of parallel electrodes disposed on the other one of the two opposing surfaces; and interconnecting conductors disposed on the elongated central portion, on the isolating springs and on the first and second tethers, interconnecting conductors electrically connecting the first and second electrodes with pads located at the ends of the arms of said tethers.

In another aspect the present invention provides a resonator with (1) an elongated central portion, the elongated central portion having a centerline along its major dimension, the elongated central portion a material which resonates, in use, in an extensional mode disposed at a right angle to said centerline, the elongated central portion having a top surface and a bottom surface with a first pair of electrodes disposed on said top surface and second pair of electrodes disposed on said bottom surface; (2) a pair of springs formed from the same material as said elongated central portion, a first one of said springs being integrally attached at a first end thereof to a first end of the elongated central portion and a second one of said springs being integrally attached at a first end thereof to a second end of the elongated central portion; (3) a first pair of tethers formed from the same material as said elongated central portion, the first pair of tethers wrapping around said first one of said springs and wrapping around a first portion of the elongated central portion; and (4) a second pair of tethers formed from the same material as said elongated central portion, the second pair of tethers wrapping around said second one of said springs and wrapping around a second portion of the elongated central portion.

In another aspect the present invention provides a resonator comprising: a unitary slab of quartz material, the unitary slab of quartz material having vertical side walls defining (i) an elongated central portion, the elongated central portion having a centerline along its major dimension, the elongated central portion resonating, in use, in an extensional mode disposed at a right angle to said centerline, (ii) a pair of isolating springs integrally connected to said central portion at the centerline thereof and (iii) a plurality of tethers, with pairs of said tethers being integrally connected with an end of each one of said isolating springs, the elongated central portion having two major opposing surfaces with a first pair of parallel electrodes disposed on one of the two opposing surfaces and with a second pair of parallel electrodes disposed on the other one of the two opposing surfaces.

In still yet another aspect the present invention provides a resonator comprising: an elongated central portion, the elongated central portion having a centerline along its major dimension and comprising a material which resonates, in use, in an extensional mode disposed at a right angle to said centerline, the elongated central portion having a top surface and a bottom surface with a first pair of electrodes disposed on said top surface and second pair of electrodes disposed on said bottom surface; a pair of springs formed from the same material as said elongated central portion, a first one of said springs being integrally attached at a first end thereof to a first end of the elongated central portion and a second one of said springs being integrally attached at a first end thereof to a second end of the elongated central portion; a first pair of tethers formed from the same material as said elongated central portion, the first pair of tethers wrapping around said first one of said springs and wrapping around a first portion of the elongated central portion; and a second pair of tethers formed from the same material as said elongated central portion, the second pair of tethers wrapping around said second one of said springs and wrapping around a second portion of the elongated central portion.

In yet another aspect the present invention provides an apparatus comprising: a unitary slab of quartz material, the unitary slab comprising a plate of quartz material and being defined by: (i) an elongated central portion, the elongated central portion having at least a pair of elongated electrodes disposed on each side of said unitary slab and parallel to a centerline located along a major dimension of said elongated central portion, the elongated central portion resonating, in use, in an extensional mode at a right angle to said centerline and (ii) a pair of isolating springs integrally connected to said central portion; and an antenna coupled with at least one of said pair of electrodes.

BRIEF DESCRIPTION OF THE DRAWINGS

FIGS. 7a and 7b are cross section views through the embodiment of FIG. 7 taken along section lines 7a-7a and 7b-7b respectively.

FIG. 7c is similar to that of FIG. 7b, but an encapsulating enclosure is also depicted.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Figure 1A:
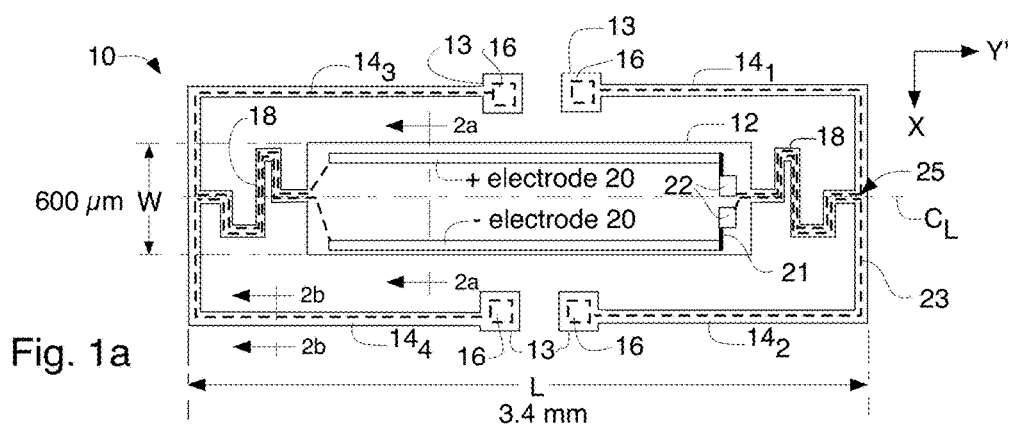
FIGS. 1a and 1b depict, respectively, a top view and a bottom view of an embodiment of the disclosed MEMS extensional-mode resonator for high Q inductor applications.
Figure 2A:
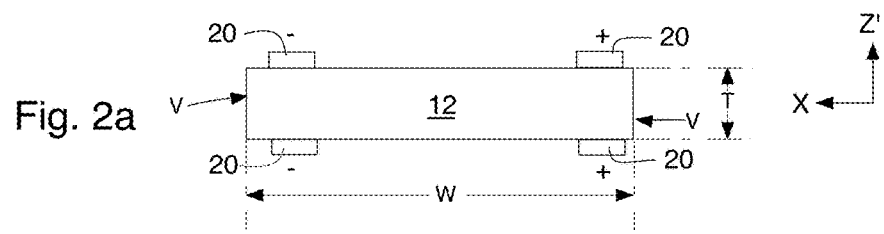
FIG. 2a is cross-section view of the extensional mode resonator.
Figure 1B:
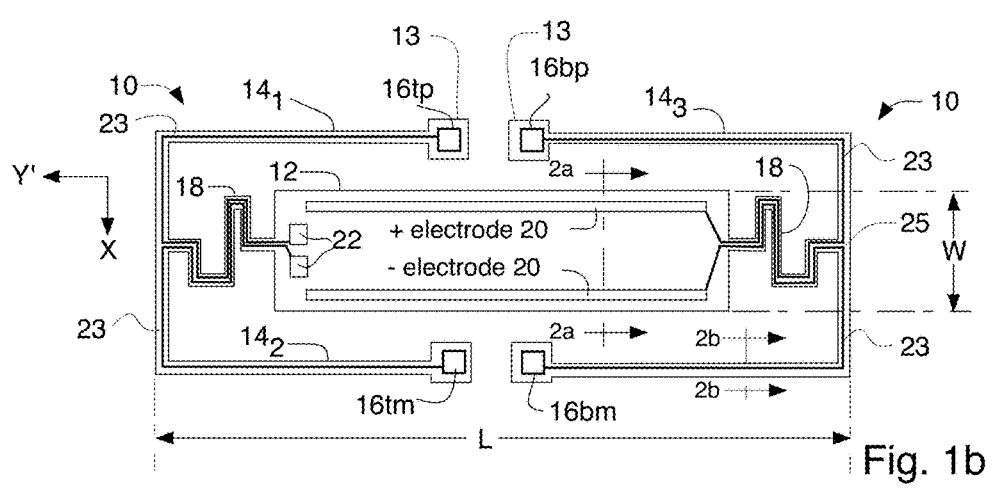

The design of a new extensional-mode HF quartz MEMS resonator 10 in accordance with certain embodiments is shown in FIG. 1a (a top view of one embodiment) and FIG. 1b (a bottom view corresponding to the embodiment of FIG. 1a) with a cross-sectional view being provided by FIG. 2a (taken along section line 2a-2a of FIGS. 1a, 1b as well as certain additional embodiments depicted by FIGS. 3 and 4) of an elongated central portion 12 of the resonator 10. The embodiment of FIGS. 1a and 1b (as well as the other depicted embodiments) may be used in high Q inductor applications. The resonator 10 is a width-extensional mode quartz crystal preferably formed of a unitary quartz plate which is preferably KT cut (preferably with a θ=27°). The plate of width-extensional mode quartz crystal resonator 10 is formed from a quartz crystal that is cut along a plane defined in the O-xyz coordinate system of the quartz crystal lattice by rotating the original Z plane around the X axis by a rotation angle θ preferably equal to 27° but the rotation angle θ may fall in the range of 20 to 35 degrees. See FIG. 1 of European Patent Application No. 92300508.6 published Jul. 29, 1992 as EPO 0496583A3.

The unitary quartz plate is cut with vertical sidewalls V to define (i) the central quartz plate portion 12, a first pair of tethers $14_1$ and $14_2$ and second pair of tethers $14_3$ and $14_4$ each pair having arms which appear in the plan view of FIG. 1a to wrap around the elongated central quartz plate portion 12 of the resonator 10 to bonding pads 16 located at the distal ends 13 of each tether $14_1$-$14_4$. The end 13 of tether $14_1$ approaches, but does not contact, the end 13 of tether $14_3$. Likewise, the end 13 of tether $14_2$ approaches, but does not contact, the end 13 tether $14_4$. Isolating springs 18 are preferably formed from the aforementioned unitary quartz plate integrally coupling central quartz plate portion 12, preferably at a centerline $C_L$ thereof, to midpoints 25 of each of the first pair of tethers $14_1$ and $14_2$ and the second pair of tethers $14_3$ and $14_4$ to allow a higher Q operation by preventing modal energy from being lost from central quartz plate portion 12 to a substrate 40 (see FIGS. 7, 7a and 7b) on which the resonator 10 is, in use, mounted.

Figure 2B:
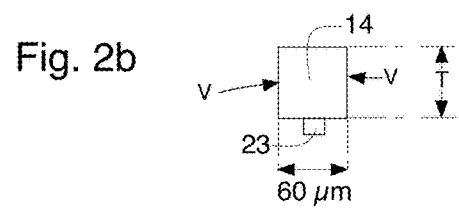
FIG. 2b is a cross-section view of a tether.

FIG. 2a is a cross sectional of the central portion 12 while FIG. 2b (taken along line 2b-2b in FIGS. 1a and 1b) is a cross sectional of a tether. A cross sectional view of the isolating springs 18 would be similar to that of FIG. 2b except that the number and location of interconnecting conductors 23 would vary as needed. The width of the isolating springs 18 and the tethers may be of any suitable width, such as 60 μm. The central quartz plate portion 12 is elongated in that its major dimension is preferably longer than dimension W depicted in the various figures. Also, central quartz plate portion 12, the isolating springs 18, the first pair of tethers $14_1$ and $14_2$ and second pair of tethers $14_3$ and $14_4$, are preferably all formed from a single quartz crystal, all occupying a common plane having a KT cut of said single quartz crystal as described above.

The central quartz plate portion 12, tethers 14 and the isolating springs 18 are all cut from the aforementioned unitary quartz plate with vertical sidewalls V. The central quartz plate portion 12, the first pair of tethers $14_1$ and $14_2$, the second pair of tethers $14_3$ and $14_4$, and the isolating springs 18 preferably have the same thickness T (see FIG. 7b). However, the distal ends 13 of the tethers 14 may be optionally formed with mesas $13_m$ (see FIG. 7b) in order to space the resonator 10 (and more particularly its central portion 12 which resonates in use) from the substrate 40. So if mesas $13_m$ are utilized, the thickness of the distal ends 13 of the tethers 14 are then thicker than dimension T. The mesas $13_m$ may be formed by laying down additional layers of metal at the bonding pads 16.

Alternatively (or in addition to using mesas $13_m$), the central quartz plate portion 12 of the resonator 10 may be spaced from the underlying substrate 40 by defining mesas 49 in the substrate 40. See reference numeral 49 on FIG. 7 and the discussion relating to it below.

The first pair of tethers $14_1$ and $14_2$ and the second pair of tethers $14_3$ and $14_4$ wrap around the central portion 12 of the resonator 10 to the bonding pads 16 at ends 13 and relieve stress from the bonding pads 16. The isolating springs 18 allow higher Q operation by preventing modal energy from being lost to the substrate 40. Positive and negative polarity electrodes 20 are formed on opposite sides of the quartz plate with vias 22 for connecting the top and bottom electrodes 20.

The distal ends 13 of the first pair of tethers $14_1$ and $14_2$ and the second pair of tethers $14_3$ and $14_4$ may be somewhat wider than are the arms of the tethers 14 in order to provide space for the bonding pads 16 and allow them to sufficient area so that when the resonator 10 is bonded to substrate 40, some misalignment may occur between the bonding pads 16 and corresponding bonding regions 41 on substrate 40 without a faulty bond occurring. When the resonator 10 is bonded to substrate 40, a compression bond may be utilized between the bonding pads 16 and corresponding bonding regions 41 on substrate 40. The bonding pads 16 in FIG. 1b (and also in FIG. 4) have subscripts tp (top positive), to (top negative), bp (bottom positive) and bn (bottom negative) so that particular bonding pads 16 may be more easily identified in this description.

Isolating springs 18 allow higher Q operation by preventing modal energy from being lost to the substrate 40. The isolating springs 18 may be of a folded spring design as depicted in the figures or of any other convenient design. The corners of the isolating springs 18 may be rounded (in plan view), but in any case the isolating springs 18 mate with the central resonator portion 12 preferably along a centerline $C_L$ thereof.

Positive and negative polarity electrodes 20 are disposed on opposing sides (see FIG. 2a) of the central portion 12 of the quartz plate with and vias 22 may be utilizing for interconnecting the top and bottom electrodes 20 (positive to positive and negative to negative).

FIG. 1a depicts a top view while FIG. 1b depicts a bottom view of one possible embodiment of a design of the proposed MEMS extensional-mode resonator 10 for high Q inductor applications. The central portion 12 vibrates, in use, in its extensional-mode and thus the vibration is along the dimension W shown in FIGS. 1a, 1b and 2a for this embodiment. The dimension W (along which extensional-mode vibration occurs) is also depicted for other embodiments as well. The first pair of tethers $14_1$ and $14_2$ and the second pair of tethers $14_3$ and $14_4$ wrap around the central portion 12 of the resonator 10 to the bonding pads 16 and help relieve stress from the bonding pads 16 due to, for example, the vibration of the central portion 12 or a thermal CTE mismatch between quartz plate of resonator 10 and the substrate 40.

A process for making the resonator of FIGS. 1a, 1b, 2a, and 2b (and the other depicted embodiments) may generally follow that described in U.S. Pat. No. 8,765,615 by etching an outline in the shape of resonator 10 from a quartz plat and defining top-side electrodes 20 and associated top-side conductors 21. The quartz plate is preferably bonded to a quartz handle wafer using an adhesive and the quartz plate is then thinned and polished to a thickness of approximately 50-100 µm (dimension T). Any vias 22, the resonator central portion 12, tethers 14, and isolation spring assembly 18 are plasma etched in the quartz plate in a single etch step preferably producing vertical or nearly vertical sidewalls for precise control of the geometries and good modal confinement of the extensional-mode resonating portion (the central portion 12) of the resonator 10.

Resonators having with different widths (dimension W) may be etched simultaneously (or separately) to produce an array of resonators (see FIG. 7) each one with a different extensional mode resonant frequency (and with a different corresponding inductance).

Positive and negative polarity electrodes 20 are deposited on the topside as depicted by FIG. 1a and topside metal interconnects 21 are deposited between the topside electrodes 20 and the vias 22. The topside electrodes 20 and the topside metal interconnects 21 may be formed at the same time. The opening of the via 22 may be formed afterwards so a portion of the topside interconnect metal may cover the via 22 opening and be used as an etch stop after the quartz plate is flipped over to form bottom side electrodes 20 and bottom side interconnects. After the bottom side interconnects are deposited (discussed below), the topside electrodes 20 (shown in solid lines on FIG. 1a) will electrically connect to bottom-side located bonding pads 16 (which are deposited later, as is also discussed below) through vias 22. Most of the interconnects occur on the bottom side of the resonator 10 in this particular embodiment, so the reader is encouraged to view also FIG. 1b which is a bottom side view thereof where most of the interconnects are shown with solid lines (as opposed to the phantom (dashed) lines of the topside view of FIG. 1a). The topside interconnects 21 connect with bottom side interconnects 23 on the bottom side of the resonator 10 by means of vias 22. The vias 22 may be located in places other than that shown for the embodiment of FIGS. 1a and 1b as will be discussed in greater detail below with respect to the embodiments of FIGS. 3 and 4. The topside interconnects 21 and topside electrodes 20 are formed as depicted in FIG. 1a and then the quartz plate is turned over to gain access to its bottom side.

The via openings thru the quartz plate may now be formed using a portion of topside interconnect 21 as an etch stop as already mentioned. The bottom electrodes 20 (shown in solid lines on FIG. 1b) are then deposited along with the bottom side interconnects 23. In this embodiment the topside positive (+) electrode 20 is electrically coupled to bottom side bonding pad $16_{tp}$ via one of the topside interconnects 21, one of the vias 22, and one of the bottom side interconnects 23 as depicted by FIGS. 1a and 1b. Similarly, the topside negative (−) electrode 20 is electrically coupled to bottom side bonding pad $16_m$ via the other one of the topside interconnects 21, the other one of the vias 22, and another one of the bottom side interconnects 23 as depicted by FIGS. 1a and 1b.

Also in this embodiment the bottom side positive (+) electrode 20 is electrically coupled to bottom side bonding pad $16_{bp}$ via one of the bottom side interconnects 23 as depicted by FIG. 1b. Similarly, the bottom side negative (−) electrode 20 is electrically coupled to bottom side bonding pad $16_{bn}$ via another one of the bottom side interconnects 23 as depicted by FIG. 1b.

After the resonator 10 is formed as depicted by FIGS. 1a, 1b and 2, the resulting quartz wafer is bonded to a thermally conductive pads 41 on substrate 40 preferably using a metal bond such an Au/In compression bond and the resulting quartz wafer is released from a handle substrate typically used to hold MEMS devices during manufacture. In this case, a plurality of resonators 20, each preferably having different widths (W) of their central portions 12, are made concurrently using a single handle substrate (not shown). The substrate 40 can be Si for integrating to on-chip electronics 44 and/or switching networks, or it can be a much more thermally conductive substrate such as copper if higher power operation is required. A copper substrate will allow better heat sinking to a cooled outer mount (not shown).

Alternatively, if substrate 40 is embodied as printer circuit board material, then electronic 44 my be embodied by one or more ICs affixed to the printer circuit board substrate.

Figure 6:
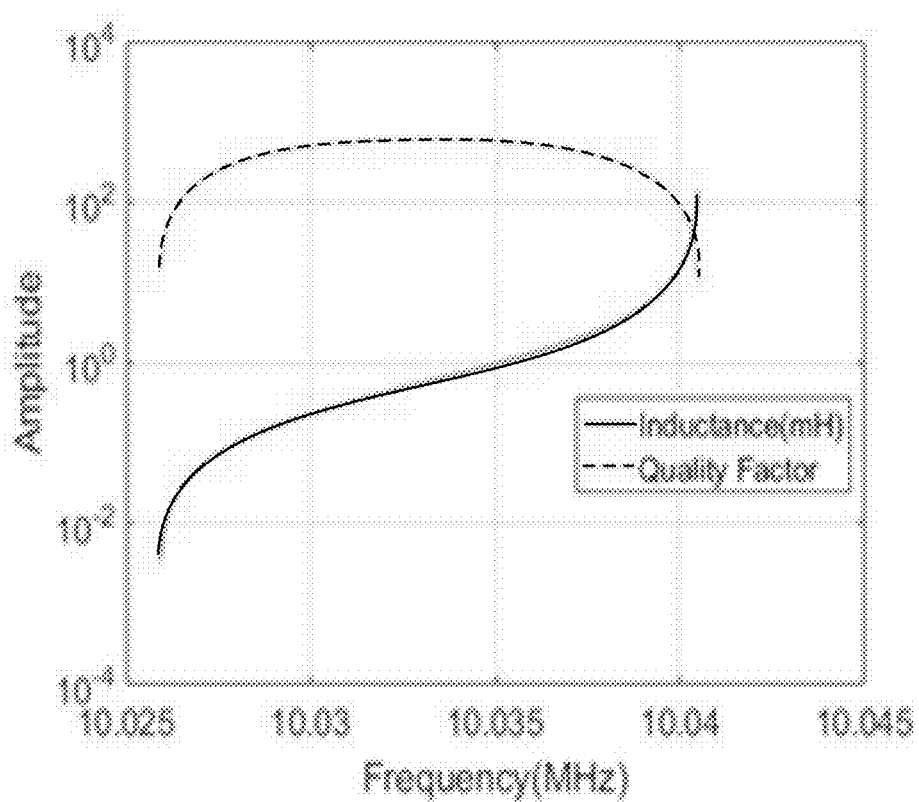
FIG. 6 is a graph showing the calculated Q and inductance of a 10-MHz extensional-mode quartz resonator used as an inductor matching element.
Figure 7:
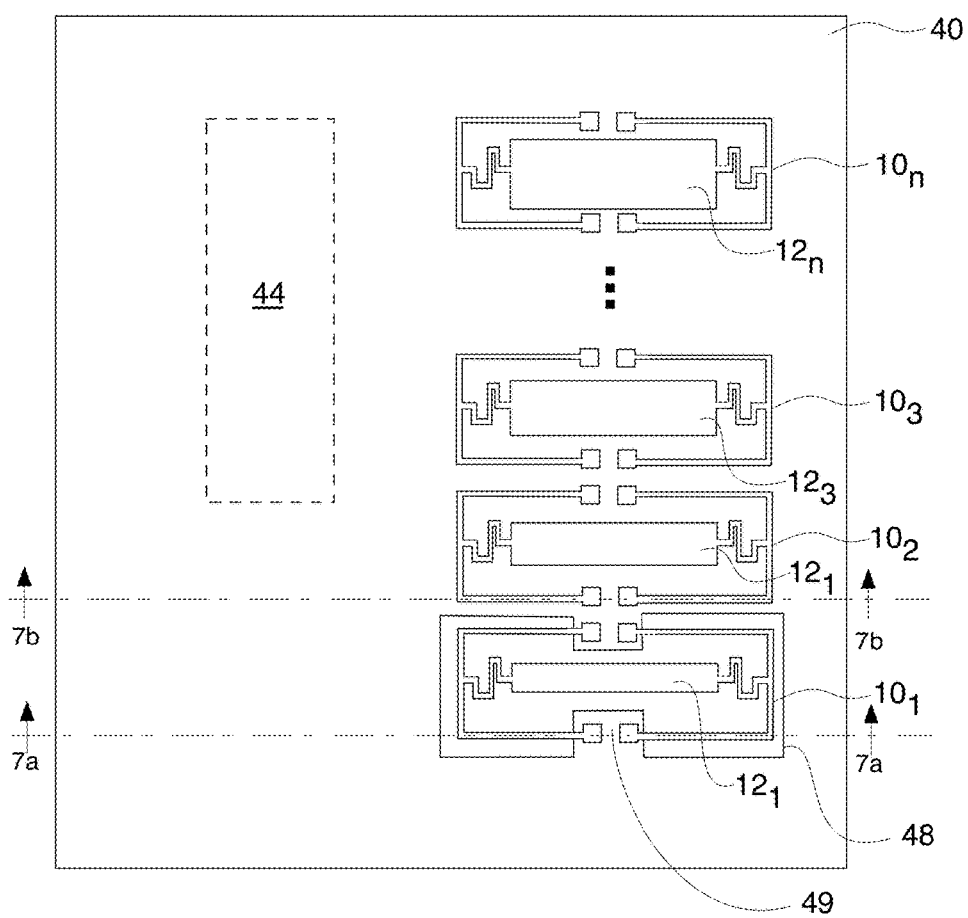
FIG. 7 is a top view of a plurality of resonators disposed on a planar substrate.

Since the frequency of an extensional-mode quartz resonator varies as 1/W (the reciprocal of its width (W)), making a plurality resonators 10 at the same time with different widths W allows for the forming an array of resonators (which might operate in the 3-10 MHz range) during a common set of process steps as described above and the mounting of same on a common substrate 40. FIG. 7 shows an array of n resonators (individually labeled $10_1$, $10_2$, $10_3$ . . . $10_n$) that are preferably made at the same time on a single handle substrate. The width W of each resonator $10_1$, $10_2$, $10_3$ . . . $10_n$ may vary through the array, for example, from about 300 µm to about 1000 µm. In order to temperature compensate the quartz resonator to the degree expected for a AT-cut shear-mode resonator (~±10 ppm from −20° C. to +100° C.), a KT-cut of quartz is suggested with a theta (θ) cut angle of between approximately +25° to +27°. Using a 10-MHz extensional mode design (see the equivalent circuit of FIG. 5) with predicted admittance values of the fundamental mode of $L_1$=200 mH, $C_1$=1.26 fF, $C_o$=0.42 pF, $R_1$=15Ω, and a Q of 840K, the inductor properties are shown in FIG. 6 for a resonator 10 with the dimensions W=600 µm and L=3.4 mm. If the resonator temperature stability is ±10 ppm over temperature, this translates to a frequency stability of ±100 Hz. As one can see from the data in FIG. 6, the inductance and Q values would be very constant with this level of temperature stability. This can only be obtained using temperature compensated quartz for the resonator material. Other materials, such as Si or AlN, would have orders of magnitude higher temperature sensitivity.

Figure 5:
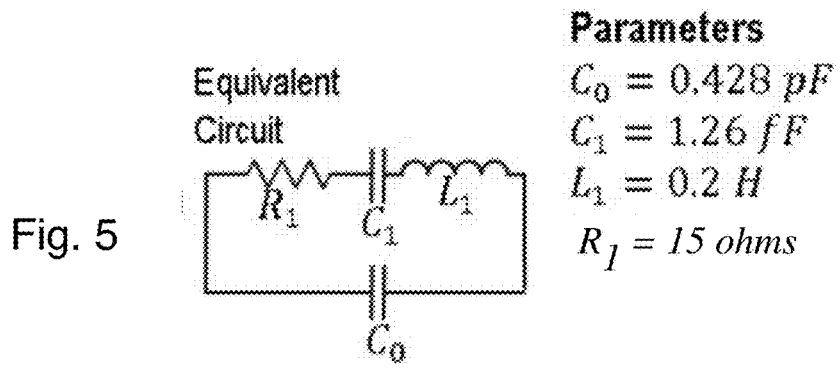
FIG. 5 depicts an equivalent circuit for the resonator of FIGS. 1a and 1b.

The length L of the resonator does not affect its frequency like its width W dimension does, but the longer the resonator 10 the lower the value of $R_1$ in the equivalent circuit of FIG. 5. The value stated above and on FIG. 1a for the length L of 3.4 mm may be varied as needed for a particular design. The thickness of the resonator can be varied slightly to optimize the modal confinement and temperature sensitivity, but in general does not have to be varied greatly for the range of frequencies discussed herein.

FIGS. 7a and 7b show cross-sectional views taken along lines 7a-7a and 7b-7b, respectively, of FIG. 7. Since the central portion 12 of the resonator 10 resonates, at least the central portion 12 and preferably also the isolating springs 18 and most of the tethers 14 should be spaced from portions of substrate 40 which might otherwise make physical contact therewith. In the embodiment of FIG. 7a the spacing is achieved at least in part by etching a portion of substrate 40 away in the region defined by an ledge 46 (see also FIG. 7a) so that a portion 49 of substrate 40 is not so etched thereby providing effectively a mesa 49 for the bonding pads 16 to mate with corresponding bonding regions 41 on the substrate 40. Additionally, metal mesas $13_m$ may be formed at the ends 13 of the tethers 14 between the the bonding pads 16 at the ends 13 of the tethers 14 to mate with corresponding bonding regions 41 on the substrate 40

In the embodiment of FIG. 7b the spacing is achieved by simply providing a mesa $13_m$ at each end 13 of the tethers 14 for mating the bonding pads 16 at the distal ends of the tethers 14 to with corresponding bonding regions 41 on the substrate 40. The bond metal at bonding pads 16 on the quartz and/or on the substrate regions 41 can be made sufficiently thick to effectively create the mesas $13_m$ to provide the desired amount of spacing between the resonating portion 12 of the resonator 10 and the substrate 40 (even without a recess region on the substrate as shown in the embodiment of FIG. 7a). There are a number of ways to provide a gap between the resonating portion 12 of the resonator 10 and substrate 40 that should be apparent to those skilled in the art of making MEMS devices and thus only two techniques are described herein with reference to FIGS. 7a and 7b.

Figure 7D:
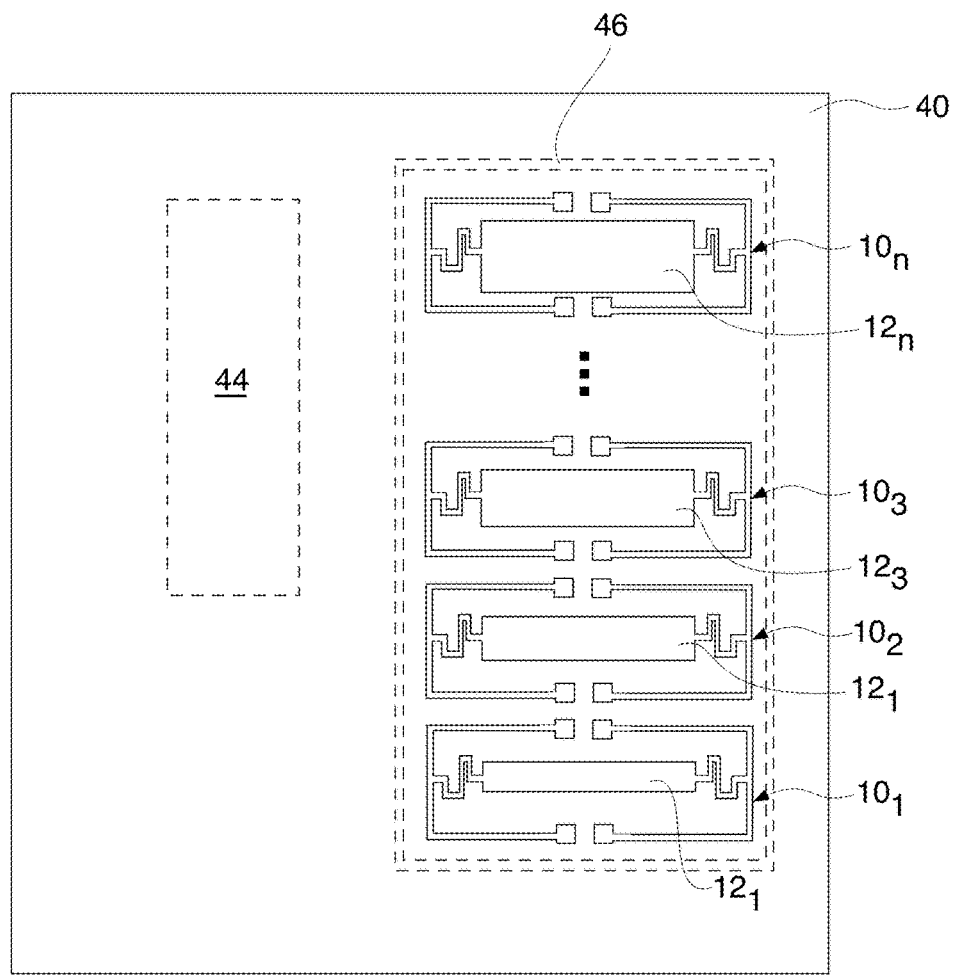
FIG. 7d is similar to that of FIG. 7, but the encapsulating enclosure is also depicted.

A capping wafer 46 preferably of a similar material as that used for the substrate (e.g., Si or Cu) is preferably bonded to the substrate for vacuum encapsulation of the resonator(s) 10 disposed on substrate 40. The bonding is preferably performed at the wafer level in a commercial wafer bonding machine using a metal solder bond such as Au/Sn to secure the capping wafer 46 to the substrate 40. A vacuum may be formed in the chamber of the bonding machine which can be backfilled with a light inert gas such as He for optimizing the Q and the power handling capabilities of the resonators 10. A vacuum lower than 1 Torr is suggested for high Q operation, but residual gas surrounding the resonator can carry heat convectively away from the resonating member 12. Therefore, an optimal pressure, for example, between 100 mT and 1 Torr using He gas may well be preferred for the gas and pressure inside the capping wafer 46. FIG. 7c is a cross section view similar to that of FIG. 7d, but the capping wafer 46 is depicted. FIG. 7d is a plan view similar to that of FIG. 7, but an outline of the walls of the capping wafer 46 where it mates with substrate 40 is shown with dashed lines at numeral 46.

Figure 8A:
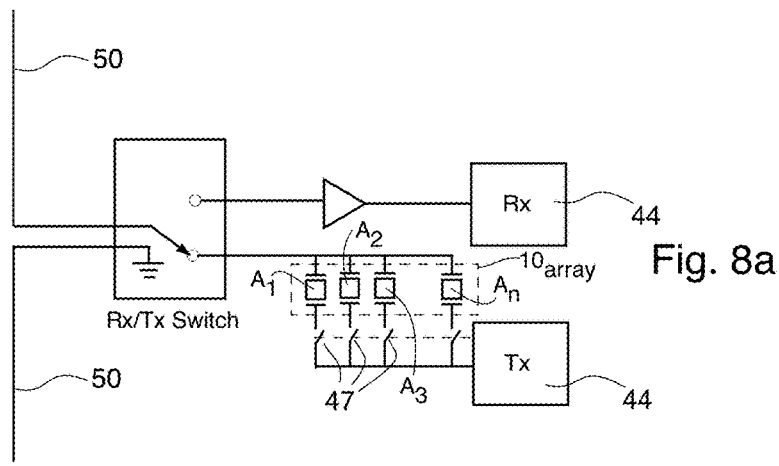
FIGS. 8a and 8b each show embodiments of a transceiver utilizing an array of individual resonators.
Figure 8B:
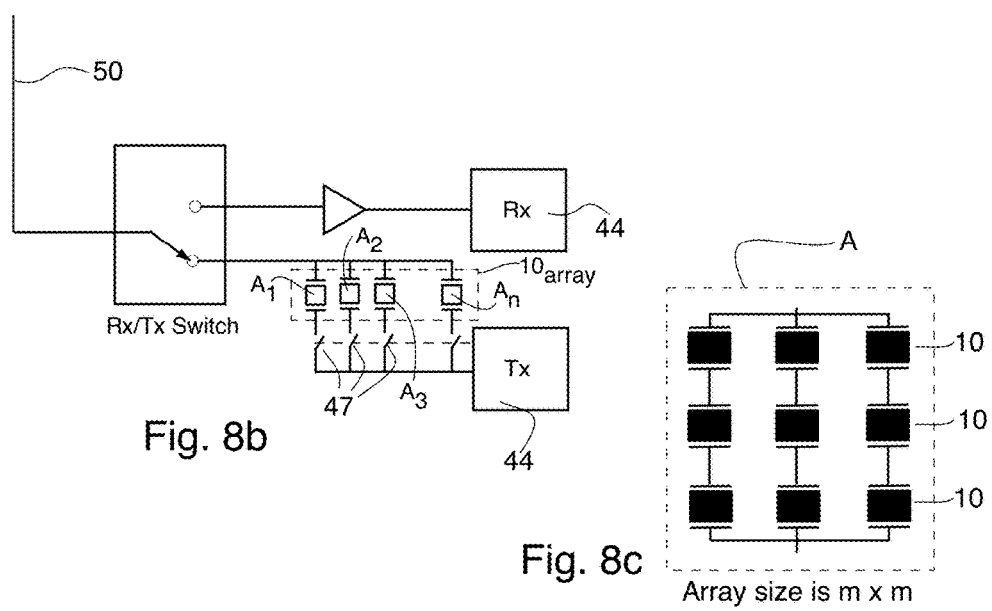
Figure 8C:
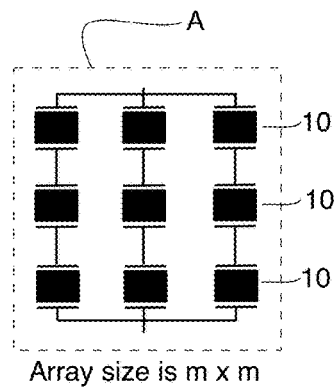
FIG. 8c demonstrates that the individual resonators in the embodiments of FIGS. 8a and 8b may themselves each be formed by an m×m array of resonators.

An array of resonators 10 (see FIG. 7d) may be packaged within the same vacuum enclosure for minimizing the total volume and weight of the final impedance matching network (see FIGS. 8a-8c). The outline of the capping wafer 46 where may be bonded to substrate 40 is shown in dashed lines on FIG. 7d.

The circuitry 44 which may be embodied in substrate 40 or in one or more ICs disposed on substrate 40 is shown only representationally by a dashed line box on FIGS. 7 and 7d. Suggested embodiments of circuitry which may be used with an array of resonators 10 having different resonate frequencies is taught by U.S. patent application Ser. No. 15/638,052 filed 29 Jun. 2017 and entitled "Antenna Loaded with Electromechanical Resonators" and that circuitry may be included in circuitry 44 if desired.

Figure 3:
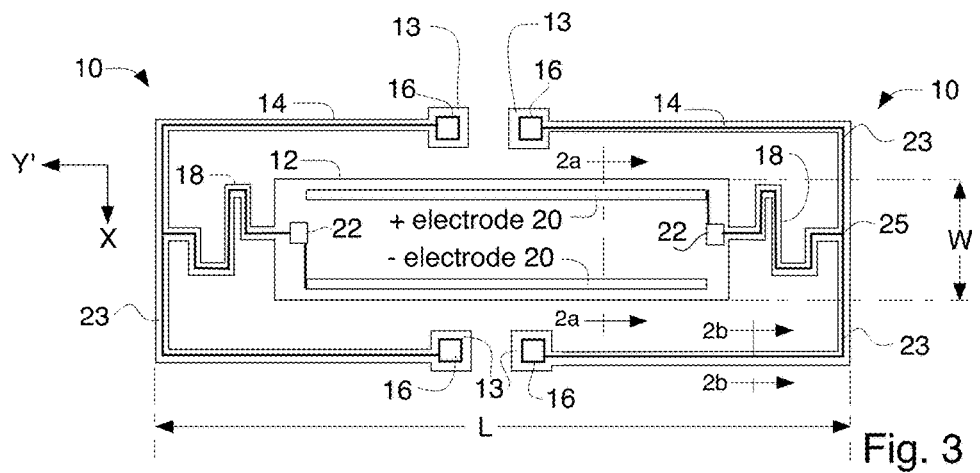
FIGS. 3 and 4 depict alternative embodiments of the disclosed MEMS extensional-mode resonator for high Q inductor applications

As noted above, the locations of the vias 22 can vary considerably. FIG. 3 is a bottom view of an embodiment of a resonator in accordance with the present invention where the vias are located near each end of the central portion 12. The bottom side interconnections 23 are shown in solid lines. The topside interconnections between the topside positive electrode 20 and the via on the right hand side of the figure cannot be seen since it lies under some of the interconnect depicted by solid lines. Similarly, the topside interconnections between the topside negative electrode 20 and the via on the left hand side of this figure cannot be seen since it lies under some of the interconnect depicted by solid lines.

Also, as in the case of the embodiment of FIGS. 1a and 1b, the vias 22 are preferably located on FIG. 3 so that they do not occupy any of the area of the central portion 12 between electrodes 20.

Furthermore, in the embodiment of FIG. 3, the top and bottom positive electrodes 20 are connected in common at the via on the right hand side of FIG. 3 while the top and bottom negative electrodes 20 are connected in common at the via on the left hand side of FIG. 3. Of course, the embodiment of FIG. 3 may be modified to bring out the connections to the top and bottom positive and negative electrode 20 separately, if desired, as is done the case of the embodiment of FIGS. 1a and 1b.

Figure 4:
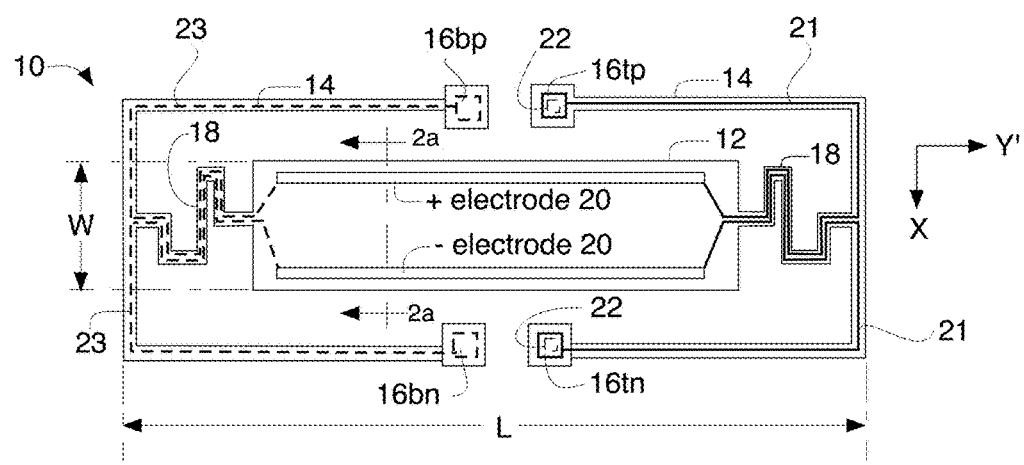

FIG. 4 is a top view of an embodiment of a resonator in accordance with the present invention where the vias are located at two of the distal ends 13 of the tethers under the bonding pads $16_{tp}$ and $16_{tn}$. The bottom side interconnections 23 are shown in dashed lines while the topside interconnects are shown in solid lines. This embodiments is similar to the embodiment of FIGS. 1a and 1b in that the connections from the top and bottom positive and negative electrode 20 are brought out separately to; (i) bond pad $16_{tp}$ (for the topside positive electrode 20); (ii) bond pad $16_{bp}$ (for the bottom side positive electrode 20); (iii) bond pad $16_{tn}$ (for the topside negative electrode 20); and (iv) bond pad $16_{bn}$ (for the bottom side positive electrode 20).

The terms positive and negative are used with the electrodes 20 merely to show that they are electrically out of phase with respect to each other. They normally would have an alternating voltage applied to them.

FIGS. 8a and 8b each show an array of resonators $10_{array}$ used for impedance matching in an antenna application such as a handheld transceiver having a transmitter Tx and a receiver Rx. A Rx/Tx Switch connects antenna element(s) 50 to either the transmitter Tx or the receiver Rx depending on whether the handheld transceiver is in its receive mode or transmit mode of operation. In the embodiment of FIG. 8a the antenna elements 50 are shown as a dipole antenna whereas in the embodiment of FIG. 8b the single antenna element 50 is shown as a monopole antenna. The array of resonators $10_{array}$ allow a large inductance, as is discussed above, to be switched in series between the antenna element(s) 50 and the transmitter Tx to achieve a better impedance match.

The individual resonators are labeled $A_1, A_2, A_3, \ldots A_n$ of array $10_{array}$. These individual resonators $A_1, A_2, A_3, \ldots A_n$ may be all disposed on the previously mentioned substrate 40 along with the Rx and Tx circuitry 44 of the handheld transceiver and, indeed, even its antenna element(s) 50, may be disposed in whole or in part on substrate 40. The individual resonators $A_1, A_2, A_3, \ldots A_n$ of array $10_{array}$ may each be embodied each as a single resonator 10 with each resonator in array having a different width W (as discussed above with reference to resonators $10_1, 10_2, 10_3, \ldots 10_n$).

Switching circuitry is preferably provided in transmitter Tx to generate switching signals which determine which the resonator(s) $A_1, A_2, A_3, \ldots A_n$ of array $10_{array}$ are individually switched in or out of use by the depicted switches 47. This switching preferably occurs in sync with the modulation (that is, the change of frequency) of the RF signal from the transmitter Tx according to whatever modulation protocol. is being utilized to transmit data to obtain a better impedance match as the transmit frequency changes. The transmitter Tx and an associated receiver Rx may also be embodied by circuitry 44 (see FIG. 7) if desired.

The individual resonators $A_1, A_2, A_3, \ldots A_n$ of array $10_{array}$ instead of being embodied by a single resonator 10, may instead be embodied by a m×m array A of resonators 10 as shown by FIG. 8c. Each resonator 10 in array A preferably has the same width W and hence each produces the same inductance. So the inductance of the array A is the same as an individual resonator 10 in array A. But the current carrying ability (and the voltage breakdown value) of the array A is greater than that of an individual resonator 10 in array A (assuming that the size m of array A is greater than 1). In FIG. 8c if m=1, then that is the same as the individual resonators $A_1, A_2, A_3, \ldots A_n$ of array $10_{array}$ each being embodied by a single resonator 10. As m gets bigger, current carrying ability (and the voltage breakdown value) of the array A improves.

The individual resonators $A_1, A_2, A_3, \ldots A_n$ array $10_{array}$ may be used with other antenna types than shown in the embodiments of FIGS. 8a and 8b, if desired (including, but not limited to, horn antennas, dish antennas, loop antennas, patch antennas, etc.), but if the array of resonators $A_1, A_2, A_3, \ldots A_n$ is used with a handheld transmitting device, then the monopole antenna of FIG. 8b may well be the preferred antenna to use in that application. Other uses and applications for individual resonators, which may be embodied as described herein, and for arrays of resonators which may be embodied as described herein, are described in aforementioned U.S. patent application Ser. No. 15/638,052 filed 29 Jun. 2017 and entitled "Antenna Loaded with Electromechanical Resonators".

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A resonator comprising: a unitary slab of quartz material, the unitary slab of quartz material having vertical side walls defining (i) an elongated central portion, the elongated central portion having a centerline along its major dimension, the elongated central portion resonating, in use, in an extensional mode disposed at a right angle to said centerline, (ii) a pair of isolating springs integrally connected to said central portion at the centerline thereof and (iii) a plurality of tethers, with pairs of said tethers being integrally connected with an end of each one of said isolating springs, the elongated central portion having two major opposing surfaces with a first pair of parallel electrodes disposed on one of the two opposing surfaces and with a second pair of parallel electrodes disposed on the other one of the two opposing surfaces.

2. The resonator of claim 1 wherein each of said tethers has an arm which wraps around a portion of said elongated central portion so that an end of the arm of one tether approaches, but does not contact, an end of an arm of another tether.

3. The resonator of claim 2 further including interconnecting conductors disposed on the elongated central portion, the isolating springs and on the first and second tethers, interconnecting conductors electrically connecting the first and second pair of electrodes with pads located at the ends of the arms of said tethers.

4. The resonator of claim 1 in which the quartz material is a single rotated KT cut with a theta angle between 20 and 35 degrees.

5. The resonator of claim 1 further comprising interconnecting conductors disposed on one side of the quartz slab that are connected to the pads located at the ends of the arms of said tethers on through vias etched in the quartz slab.

6. The resonator of claim 1 in which the quartz slab is bonded to a semiconductor substrate.

7. The resonator of claim 1 in which the quartz slab is bonded to a quartz substrate.

8. The resonator of claim 1 in which the quartz slab is bonded to a thermally conductive substrate, preferably, copper.

9. The resonator of claim 1 in which the quartz slab oscillates with a frequency between 500 kHz to 30 MHz.

10. The resonator of claim 1 in which the quartz slab is encapsulated at a wafer-level using a capping wafer bonded to a substrate supporting the quartz slab.

11. An apparatus comprising a plurality of resonators according to claim 1, the plurality of resonators disposed on a common substrate and forming a resonator array in which at least some resonators have a different resonant frequency than other resonators in said resonator array.

12. The resonator of claim 6 further interconnecting conductors on the quartz slab are connected to electronics in the semiconductor substrate and to the first and second pairs of electrodes on the elongated central portion.

13. The apparatus of claim 11 wherein, in use, the resonators in said resonator array provide inductive impedance matching to an antenna.

14. The apparatus of claim 13 in which each resonator of a different frequency are connected to the antenna with RF switches.

15. The apparatus of claim 11 in which resonators of the same resonant frequency are connected in series and/or parallel to adjust said impedance matching.

16. The resonator of claim 1 wherein said plurality of tethers comprises four tethers with two of said four tethers being integrally connected to a first one of said isolating springs and with another two of said four tethers being integrally connected to a second one of said isolating springs.

17. The resonator of claim 16 wherein one of the tethers of said two of said four tethers has an arm which includes a ninety degree turn wrapping around a first portion of said elongated central portion and one of the tethers of said another two of said four tethers has an arm which includes a ninety degree turn wrapping around a second portion of said elongated central portion, the arm of said one of the tethers of said two of said four tethers has an end and the arm of said one of the tethers of said another two of said four tethers also has an end, the end of the arm of said one of the tethers of said two of said four tethers and the end the arm of said one of the tethers of said another two of said four tethers approach each other along a path which parallels the centerline of the elongated central portion of the resonator.

18. The resonator of claim 1 wherein the first and second pairs of parallel electrodes disposed on said elongated central portion are disposed parallel to the centerline of the elongated central portion of the resonator.

19. The resonator of claim 1 wherein the elongated central portion, the pair of isolating springs and at least some of the tethers have conductors disposed thereon for interconnecting the electrodes disposed on the elongated central portion with bonding pads located at the ends of said at least some of the tethers.

20. The resonator of claim 1 wherein the elongated central portion, the pair of isolating springs and each of the tethers have conductors disposed on at least one surface thereof for interconnecting the electrodes disposed on the elongated central portion with bonding pads located at the ends of said tethers.

21. A resonator comprising:
a. an elongated central portion, the elongated central portion having a centerline along its major dimension and comprising a material which resonates, in use, in an extensional mode disposed at a right angle to said centerline, the elongated central portion having a top surface and a bottom surface with a first pair of electrodes disposed on said top surface and second pair of electrodes disposed on said bottom surface;

b. a pair of springs formed from the same material as said elongated central portion, a first one of said springs being integrally attached at a first end thereof to a first end of the elongated central portion and a second one of said springs being integrally attached at a first end thereof to a second end of the elongated central portion;

c. a first pair of tethers formed from the same material as said elongated central portion, the first pair of tethers wrapping around said first one of said springs and wrapping around a first portion of the elongated central portion; and d. a second pair of tethers formed from the same material as said elongated central portion, the second pair of tethers wrapping around said second one of said springs and wrapping around a second portion of the elongated central portion.

22. The resonator of claim 21 wherein each one of the first pair of tethers and each one of the second pair of tethers have ends located remotely from said first and second ones of said springs, the ends of the tethers having bonding pads and wherein said resonator further has conductors disposed on said elongated central portion, on said springs and on said tethers for interconnecting the electrodes disposed on said elongated central portion with said bonding pads.

23. The resonator of claim 22 wherein each of the electrodes disposed on the elongated central portion is each independently connected with a different one of said bonding pads by said conductors.

24. The resonator of claim 22 wherein the first and second pairs of electrodes disposed on said elongated central portion are disposed parallel to the centerline of the elongated central portion of the resonator.

25. The resonator of claim 24 wherein a major portion of each of said tethers is disposed parallel to the centerline of the elongated central portion of the resonator.

26. An apparatus comprising a plurality of resonators according to claim 21 wherein said resonators are disposed in an array of said resonators.

27. The apparatus of claim 26 wherein at least some of said resonators in said array of resonators having different widths than other resonators in said array of resonators.

28. The apparatus of claim 27 further including a RF transmitter connected to said array of resonators.

29. The apparatus of claim 28 further including at least one antenna element connected to said RF transmitter and to said array of resonators.

30. The apparatus of claim 29 further including circuitry for switching a selected one or selected ones of the resonators in said array into a circuit connection with said antenna elements for adjusting an impedance match between the RF transmitter and said at least one antenna element.

31. An apparatus comprising:
a. a unitary slab of quartz material, the unitary slab of a plate of quartz material having vertical side walls defining; (i) an elongated central portion, the elongated central portion having at least a pair of electrodes disposed on each side of said unitary slab parallel to a centerline located alone a major dimension of said elongated central portion, the elongated central portion resonating, in use, in an extensional mode disposed at a right angle to said centerline and (ii) a pair of isolating springs integrally connected to said central portion at the centerline thereof;
b. an antenna coupled with said pair of electrodes.

32. The apparatus of claim 31 further including a substrate, the substrate supporting a plurality of said unitary slabs of quartz material and RF switches for selectively coupling pairs of the electrodes with said antenna, at least some of the elongated central portions of the plurality of said unitary slabs of quartz material having different widths.

33. An apparatus comprising:
a. a unitary slab of quartz material, the unitary slab comprising a plate of quartz material and being defined by: (i) an elongated central portion, the elongated central portion having at least a pair of elongated electrodes disposed on each side of said unitary slab and parallel to a centerline located along a major dimension of said elongated central portion, the elongated central portion resonating, in use, in an extensional mode at a right angle to said centerline and (ii) a pair of isolating springs integrally connected to said central portion;
b. an antenna coupled with at least one of said pair of electrodes.

34. The apparatus of claim 33 further including a substrate, the substrate supporting a plurality of said unitary slabs of quartz material and RF switches for selectively coupling pairs of the electrodes with said antenna, at least some of the elongated central portions of the plurality of said unitary slabs of quartz material having different widths.

35. The apparatus of claim 34 further including a plurality of tethers, with pairs of said tethers being integrally connected to an end of each one of said isolating springs at one end thereof and mounted to said substrate at another end thereof.

36. The apparatus of claim 35 wherein said antenna is coupled with at least one of said pair of electrodes by one or more conductors disposed on one or more of said isolating springs and tethers.

* * * * *